(12) United States Patent
Akarvardar et al.

(10) Patent No.: US 9,006,077 B2
(45) Date of Patent: Apr. 14, 2015

(54) GATE LENGTH INDEPENDENT SILICON-ON-NOTHING (SON) SCHEME FOR BULK FINFETS

(71) Applicant: GlobalFoundries, Inc., Grand Cayman (KY)

(72) Inventors: Murat Kerem Akarvardar, Saratoga Springs, NY (US); Ajey Poovannummoottil Jacob, Albany, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 13/971,937

(22) Filed: Aug. 21, 2013

(65) Prior Publication Data

US 2015/0056781 A1  Feb. 26, 2015

(51) Int. Cl.
*H01L 21/76* (2006.01)
*H01L 21/84* (2006.01)
*H01L 21/00* (2006.01)
*H01L 21/762* (2006.01)
*H01L 21/02* (2006.01)

(52) U.S. Cl.
CPC .... *H01L 21/76264* (2013.01); *H01L 21/02488* (2013.01)

(58) Field of Classification Search
CPC ............... H01L 27/10826; H01L 27/10829; H01L 29/785; H01L 29/66795; H01L 29/6681; H01L 21/823821; H01L 21/823885; H01L 21/823431

USPC ................... 438/156, 413, 421, 422
See application file for complete search history.

(56) References Cited

U.S. PATENT DOCUMENTS

| 5,057,450 | A | * | 10/1991 | Bronner et al. | 438/412 |
| 6,670,212 | B2 | * | 12/2003 | McNie et al. | 438/52 |
| 2005/0118783 | A1 | * | 6/2005 | Oh et al. | 438/421 |
| 2011/0147839 | A1 | * | 6/2011 | Yagishita et al. | 257/347 |

* cited by examiner

*Primary Examiner* — Karen Kusumakar
(74) *Attorney, Agent, or Firm* — Ingrassia Fisher & Lorenz, P.C.

(57) ABSTRACT

Methods for fabricating integrated circuits and FinFET transistors on bulk substrates with active channel regions isolated from the substrate with an insulator are provided. In accordance with an exemplary embodiment, a method for fabricating an integrated circuit includes forming fin structures overlying a semiconductor substrate, wherein each fin structure includes a channel material and extends in a longitudinal direction from a first end to a second end. The method deposits an anchoring material over the fin structures. The method includes recessing the anchoring material to form trenches adjacent the fin structures, wherein the anchoring material remains in contact with the first end and the second end of each fin structure. Further, the method forms a void between the semiconductor substrate and the channel material of each fin structure with a gate length independent etching process, wherein the channel material of each fin structure is suspended over the semiconductor substrate.

19 Claims, 6 Drawing Sheets

GATE LENGTH INDEPENDENT SILICON-ON-NOTHING (SON) SCHEME FOR BULK FINFETS

TECHNICAL FIELD

The present disclosure generally relates to methods for fabricating integrated circuits, and more particularly relates to methods for fabricating integrated circuits with FinFET devices on bulk substrates with channel regions isolated from the substrate.

BACKGROUND

As the critical dimensions of integrated circuits continue to shrink, a common difficulty faced by both planar and non-planar transistor structures is source-to-drain leakage. Typically, halo or punchthrough implants are used as counterdoped regions under or proximate the channel region to minimize source-to-drain leakage. However, formation of such implants often causes undesirable doping of, or other damage to, the channel region. Further, these implants are frequently not sufficient to inhibit source-to-drain leakage.

A process for inhibiting source-to-drain leakage in planar transistor structures is the use of "silicon-on-nothing" or "SON" technology to form an insulator under the gate. Heretofore, such a process has not been effectively utilized for non-planar multigate field effect transistor devices, referred to herein generally as FinFETS. The planar SON process forms a void under the transistor channel material while anchoring the transistor channel material from above with the already-formed gate. However, for bulk FinFETs, the presence of the gate over the transistor channel material during SON process void formation causes several drawbacks including gate length dependence of the removal process.

Accordingly, it is desirable to provide methods for fabricating integrated circuits with FinFET devices having reduced source-to-drain leakage. Further, it is desirable to provide methods for fabricating bulk FinFET transistors having channel regions isolated from the substrate. It is also desirable to provide methods for fabricating bulk FinFET transistors that form voids under active channel regions using gate length independent etching processes. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits and FinFET transistors with isolated channel regions are provided. In accordance with an exemplary embodiment, a method for fabricating an integrated circuit includes forming fin structures overlying a semiconductor substrate. Each fin structure includes a channel material and extends in a longitudinal direction from a first end to a second end. The method uses the STI regions as the anchoring material for the suspended fin structures. The method includes recessing the anchoring material to form trenches adjacent the fin structures and the anchoring material remains in contact with the first end and the second end of each fin structure. The method further includes forming a void between the semiconductor substrate and the channel material of each fin structure with a gate length independent etching process, wherein the channel material of each fin structure is suspended over the semiconductor substrate.

Methods for fabricating integrated circuits and FinFET transistors with isolated channel regions are provided. In accordance with one embodiment, a method for fabricating an integrated circuit includes forming a fin overlying a semiconductor substrate, wherein the fin includes a channel material. The method forms a void between the channel material and semiconductor substrate with a gate length independent sacrificial etching process to isolate the channel material. The method further includes forming a gate structure overlying the fin after forming the void.

In accordance with another embodiment, a method for fabricated an integrated circuit is provided. The method for fabricating an integrated circuit includes forming a fin overlying a semiconductor substrate. The fin includes a sacrificial layer having sidewalls and a channel material overlying the sacrificial layer. The method includes etching through the sidewalls of the sacrificial layer and forming a void in the fin between the channel material and the semiconductor substrate. Further, the method includes depositing a dielectric material in the void to create an isolation block under the channel material.

BRIEF DESCRIPTION OF THE DRAWINGS

Embodiments of the methods for fabricating integrated circuits and FinFETS having isolated channel regions will hereinafter be described in conjunction with the following drawing figures, wherein like numerals denote like elements, and wherein:

FIGS. 1-11 illustrate a portion of an integrated circuit and a method for fabricating the integrated circuit in accordance with an exemplary embodiment, wherein:

FIGS. 1, 2, 4-9 and 11 illustrate, in cross section, a portion of the integrated circuit and steps of the method of FIGS. 1-11;

FIG. 3 is an overhead view of the portion of the integrated circuit of FIG. 2 illustrating the ends of the fin structures; and FIG. 10 is an overhead view of the portion of the integrated circuit of FIG. 8 illustrating support of the channel regions of the fin structures.

DETAILED DESCRIPTION

Figure 1:
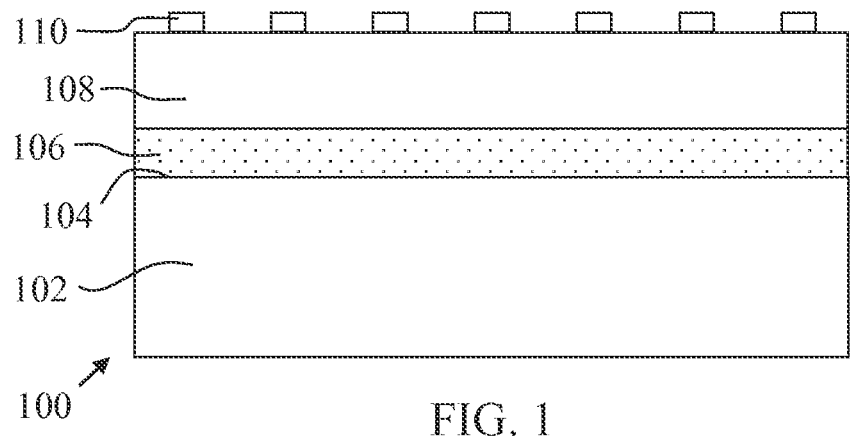

The following detailed description is merely exemplary in nature and is not intended to limit the methods for fabricating integrated circuits as claimed herein. Furthermore, there is no intention to be bound by any expressed or implied theory presented in the preceding technical field, background or brief summary, or in the following detailed description.

In accordance with the various embodiments herein, methods for fabricating integrated circuits with FinFET structures having isolated channel regions are provided. Generally, the following embodiments relate to the formation of an integrated circuit including fin structures, i.e., FinFETS or other non-planar transistors. In conventional FinFET processing, fin structures are formed from and over a semiconductor substrate. Conventional FinFETs typically exhibit source-to-drain or punchthrough leakage. Halo or punchthrough implants are formed as counterdoped regions under and or proximate the channel region to minimize source-to-drain leakage. However, formation of such implants often causes undesirable doping of, or other damage to, the channel region. Further, these implants are frequently not sufficient to inhibit source-to-drain leakage for extremely short channel devices (such as those with channel lengths of less than 20 nm).

In contrast, the methods for fabricating integrated circuits described herein suppress source-to-drain leakage by isolating the undoped active fin channel regions. The methods described herein form voids under fin channel regions before gate structures are formed over the channel regions. Therefore, the void formation process is gate-length independent, i.e., it is uniform for all devices regardless of gate length. Further, the methods described herein provide for formation of voids under fin channel regions by etching sacrificial material underlying the channel regions from the sides of the fin structures, rather than from the ends of the fin structures. This particular strategy is beneficial for fin structures having uniform widths and varying lengths because it provides a uniform etch time for all fins. Further, this approach provides for improved filling of the voids with dielectric material to isolate the channel regions. Exemplary methods form voids under fin channel regions before the formation of gate structures, such as a sacrificial or dummy gate, over the fin structure.

FIGS. 1-11 illustrate sequentially a method for fabricating an integrated circuit having FinFET structures with isolated channel regions in accordance with various embodiments herein. The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Turning now to FIG. 1, in an exemplary embodiment, the process of fabricating an integrated circuit 100 begins by providing a semiconductor substrate 102. An exemplary semiconductor substrate 102 is a silicon material as is typically used in the semiconductor industry, e.g., relatively pure silicon as well as silicon admixed with other elements such as germanium, carbon, and the like. Alternatively, the semiconductor material can be germanium, gallium arsenide, or the like. Further, the semiconductor substrate 102 may optionally include an epitaxial layer (epi layer). The semiconductor substrate 102 has an upper surface 104.

A sacrificial layer 106 is formed overlying the upper surface 104 of the semiconductor substrate 102 according to well-known processes. As used herein "overlying" means "on" and "over". In this regard, the sacrificial layer 106 may lie directly on the upper surface 104 such that it makes physical contact with upper surface 104 or it may lie over the upper surface 104 such that another material layer, for example, another semiconductor material layer, is interposed between the upper surface 104 and sacrificial layer 106. In an exemplary embodiment, the sacrificial layer 106 is silicon germanium (SiGe) and is epitaxially grown on the upper surface 104 to a thickness of about 5 nanometers (nm) to about 30 nm. The sacrificial layer 106 may be formed as a strained layer if there is a lattice mismatch between the sacrificial layer 106 and the semiconductor substrate 102, such as between SiGe and silicon.

A channel material 108 is formed overlying the sacrificial layer 106. The channel material 108 may be formed from any material suitable for service as the channel. In an exemplary embodiment, the channel material is silicon that is epitaxially grown on the sacrificial layer 106 to a thickness of about 20 nm to about 40 nm, such as about 30 nm. As shown, a mask 110, such as a photoresist, is deposited over the channel material 108 and patterned. More advanced techniques, such as sidewall image transfer can be used to achieve sub-10 nm fin widths and down to 35 nm fin pitches.

Figure 2:
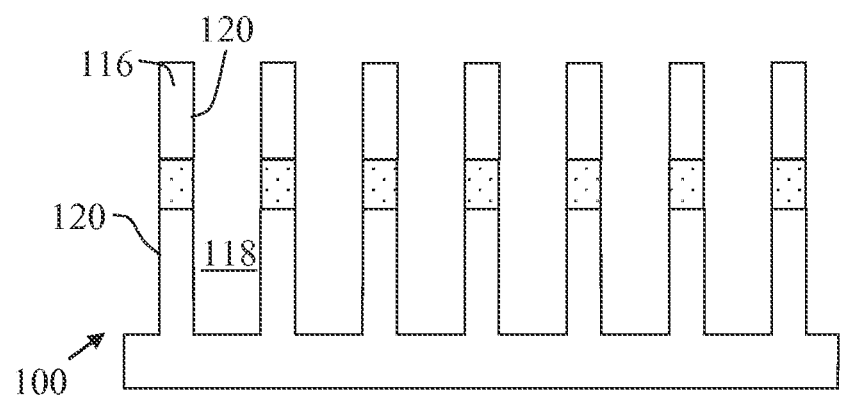
Figure 3:
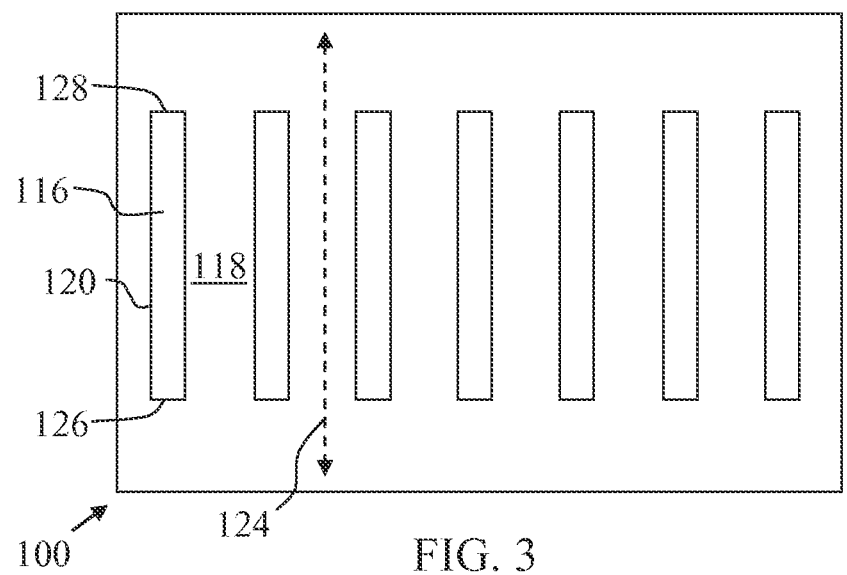

FIGS. 2 and 3 illustrate the partially completed integrated circuit 100 after a dry etch process is performed to form fin structures 116. After formation of the fin structures 116, the mask 110 is removed. As shown, the fin structures 116 are formed by etching trenches 118 through the channel material 108, through the sacrificial layer 106, and into the semiconductor substrate 102 labeled in FIG. 1. The fin structures 116 are formed with substantially parallel sidewalls 120. As shown in FIG. 3, the fin structures 116 extend in the direction of a longitudinal axis 124 such that exemplary sidewalls 120 are substantially parallel to longitudinal axis 124. Further, each fin structure 116 is formed with a first end 126 and a second end 128.

Figure 4:
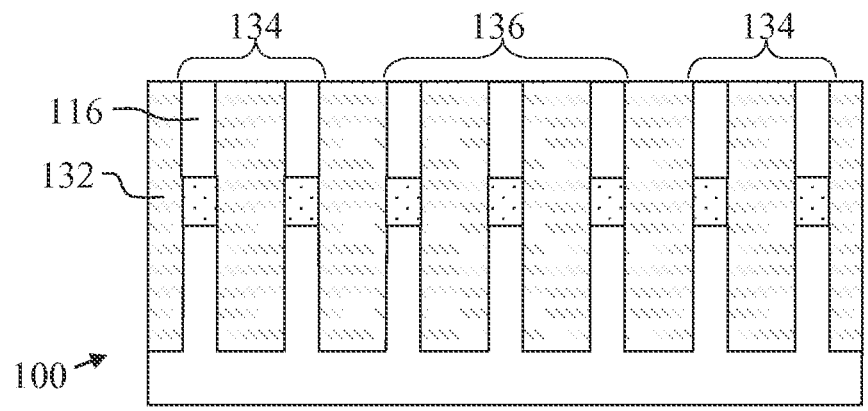

As shown in FIG. 4, a dielectric material 132 is deposited over the partially completed integrated circuit 100 to fill the trenches 118. The dielectric material 132 may be deposited by a high aspect ratio process (HARP). Specifically, the dielectric material 132 may be an oxide that is deposited by a chemical vapor deposition (CVD) process with a greater than 7:1 high aspect ratio gap-fill capability. The dielectric material 132 is typically deposited to form an overburden overlying the top surface of the fin structures 116. A planarization process, such as chemical mechanical planarization (CMP), may be performed to remove all material above the fin structures 116.

Figure 5:
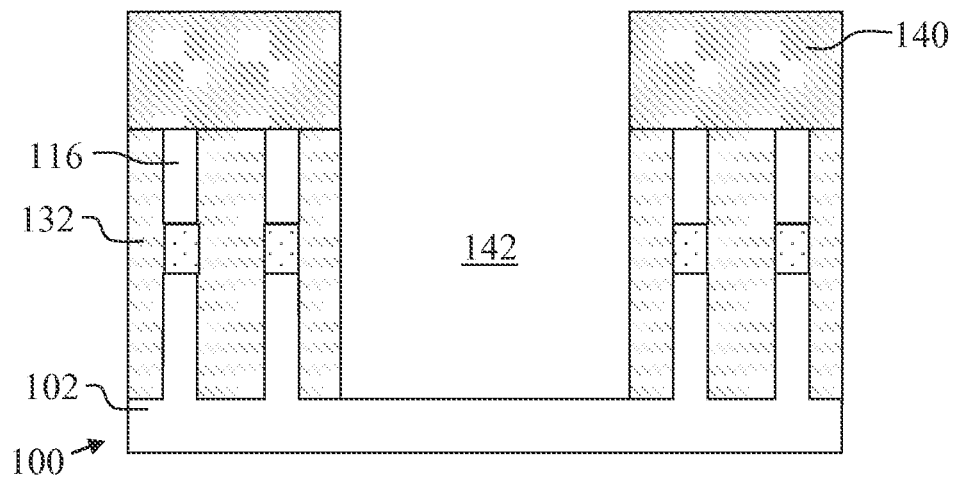

The fin structures 116 include a selected portion 134 of fin structures 116 and a non-selected portion 136 of fin structure 116. In the fabrication process, the selected portion 134 of fin structures 116 are intended to be present in the integrated circuit when completed, whereas the non-selected portion 136 of fin structures 116 are removed during fabrication processing. As shown in FIG. 5, a mask layer 140, such as a silicon nitride hard mask, is deposited and patterned over the dielectric material 132 and fin structures 116. The mask layer 140 covers the selected portion 134 of fin structures 116 and exposes the non-selected portion 136 of fin structures 116. An anisotropic etch is performed with the mask layer 140 in place to remove the non-selected portion 136 of fin structures 116 and the dielectric material 132 between the non-selected portion 136 of fin structures 116. As a result of the etch, a gap 142 is formed and exposes the semiconductor substrate 102.

Figure 6:
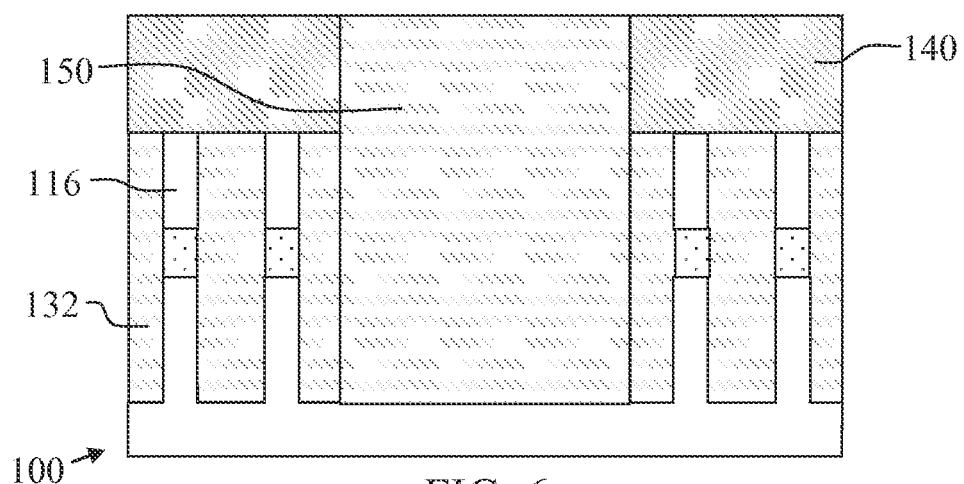
Figure 7:
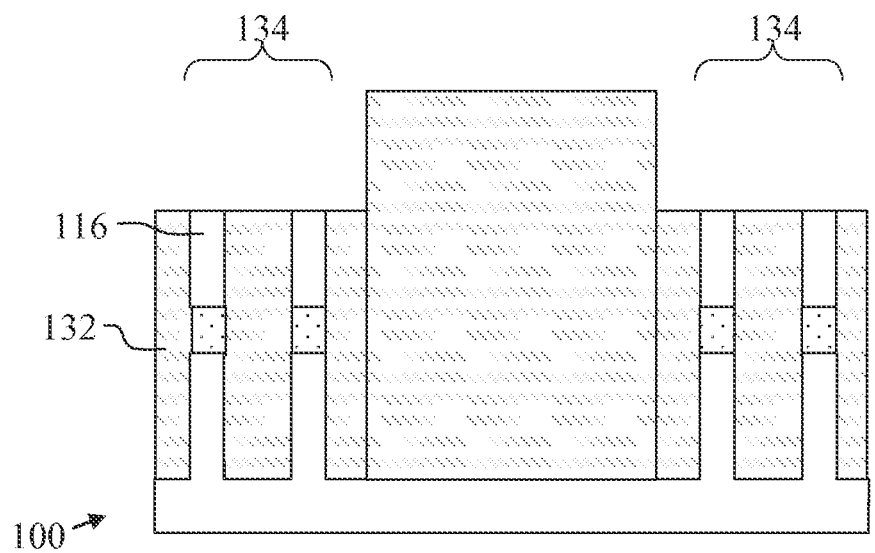

Referring to FIG. 6, the mask layer 140 remains over the partially completed integrated circuit 100 and the gap 142 is filled with the dielectric material 150, such as for example a silicon oxide, that forms a shallow trench isolation (STI). The dielectric material 150 is already present in the integrated circuit fabrication process as it forms the STI. In addition to forming the STI, the dielectric material 150 will be later utilized as an anchoring material for the fin structures 116 during processing. In an exemplary embodiment, the dielectric material 150 is the same material as the dielectric material 132. The dielectric material 150 may be deposited by a blanket deposition process and form an overburden portion above the mask layer 140. The overburden portion may be removed by CMP. In FIG. 7, the partially completed integrated circuit 100 is illustrated after the mask layer 140 is selectively removed to expose the top of dielectric material 132 and the top of the fin structures 116 in the selected portion 134 of fin structures 116.

Figure 8:
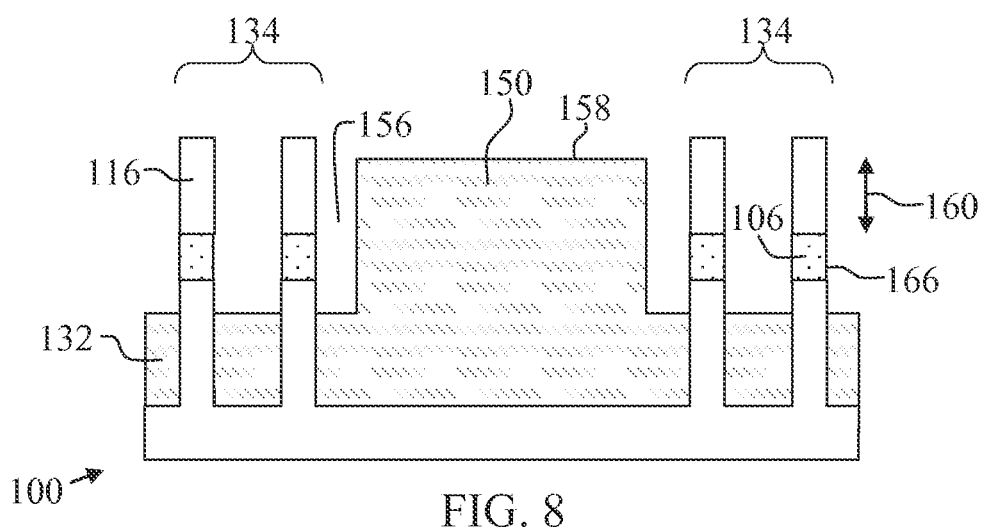

FIG. 8 illustrates the partially completed integrated circuit 100 after simultaneously recessing the dielectric materials 132 and 150 to form trenches 156 adjacent the fin structures 116 in the selected portion 134 of fin structures 116. Further, a recessed surface 158 of dielectric material 150 is formed at a selected height, indicated by double headed arrow 160, above the sacrificial layer 106. As shown, the trenches 156 expose sidewalls 166 of the sacrificial layer 106.

Figure 9:
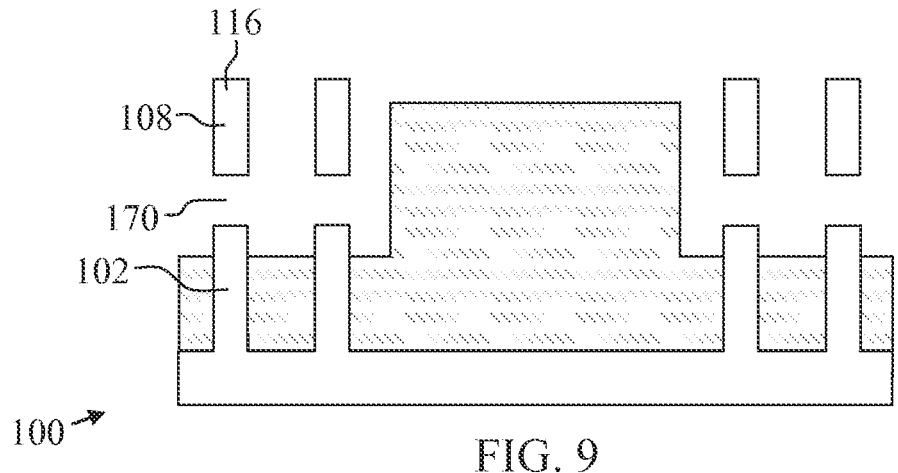
Figure 10:
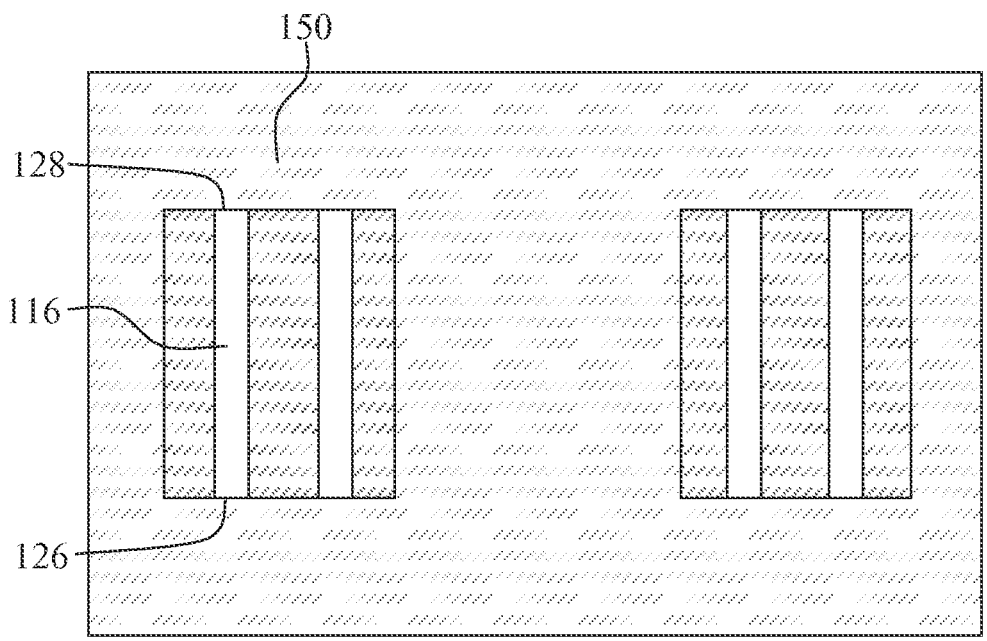

In FIGS. 9 and 10, the sacrificial layer 106 is selectively removed to form a void 170 between the active channel material 108 and the semiconductor substrate 102 in each fin structure 116. A selective etchant is contacted with and etches the exposed sidewalls of the sacrificial layer 106. Because the fin structures 116 have uniform widths, the sacrificial layers 106 have uniform widths and are completely removed by exposure to the etchant for a same uniform duration of time regardless of whether the fin structures 116 have varying lengths. In an exemplary embodiment, the sacrificial layer 106 is SiGe and the selective etchant is HCl. As shown in FIG. 10, each fin structure 116 is in contact with and is supported by or anchored by the dielectric material 150 at each end 126 and 128. Therefore, voids 170 may be formed under the channel material 108 without compromising the structural integrity of the channel material 108. The active channel material 108 forms suspended bridges within the STI isolation material 150.

Figure 11:
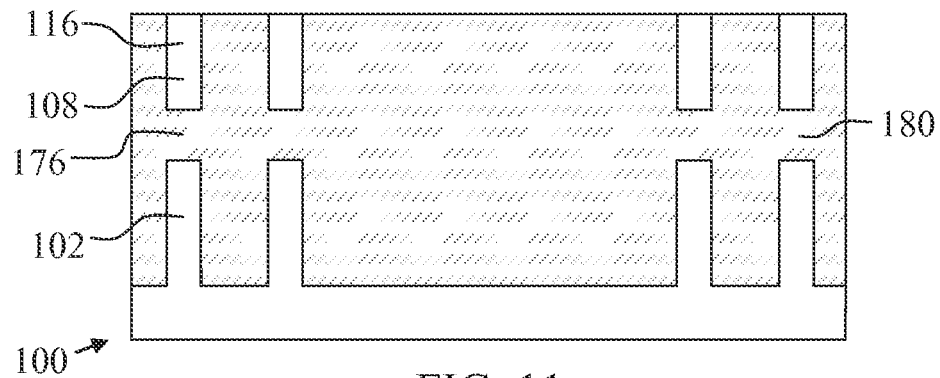

The voids 170 between the channel material 108 and the semiconductor substrate 102 are filled with a dielectric material 176 in FIG. 11. As shown, the dielectric material 176 is conformally deposited to fill the trenches 156 and the voids 170. In an exemplary embodiment, the dielectric material 176 is the same material as dielectric material 132 and 150, such as a silicon oxide. The dielectric material 176 may be deposited to form an overburden portion above the fin structures 116 that is planarized by CMP.

Figure 12:
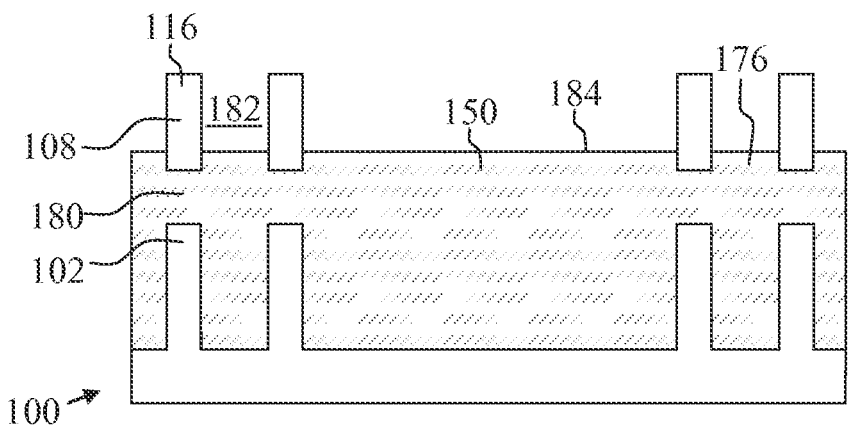
FIGS. 12-13 and 14-15 illustrate, in cross section, two embodiments of processes for forming gate structures over the portion of the integrated circuit of FIGS. 9 and 10.
Figure 13:
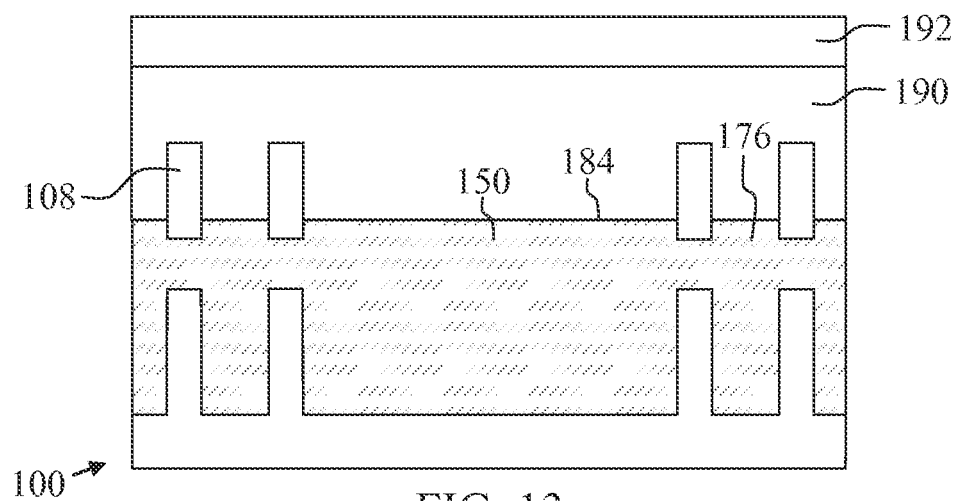

FIGS. 12 and 13 illustrate an exemplary embodiment for forming gate structures, such as sacrificial or dummy gate structures over the partially completed integrated circuit 100. In FIG. 12, an isotropic recess process is performed to form trenches 182 between the channel material 108 of the fin structures 116. As shown, the dielectric materials 150 and 176 are etched to form a lowered surface 184. Lowered surface 184 contacts the channel material 108 and lies above the isolation blocks 180 between the channel material 108 and the semiconductor substrate 102. In FIG. 13, a gate structure 190 is formed over integrated circuit 100. Specifically, the gate structure 190 is formed on the exposed portions of the channel material 108 and on the lowered surface 184 of the dielectric materials 150 and 176. The gate structure 190 may include a gate dielectric layer lying on the channel material 108 and the lowered surface 184 and a sacrificial gate material, such as polycrystalline silicon, lying on the gate dielectric layer. Further, a gate cap 192 may be formed over the gate structure 190. Further conventional processing of the integrated circuit 100 of FIG. 13 may include spacer formation, source/drain formation, replacement gate formation, contact formation, and metallization.

Figure 14:
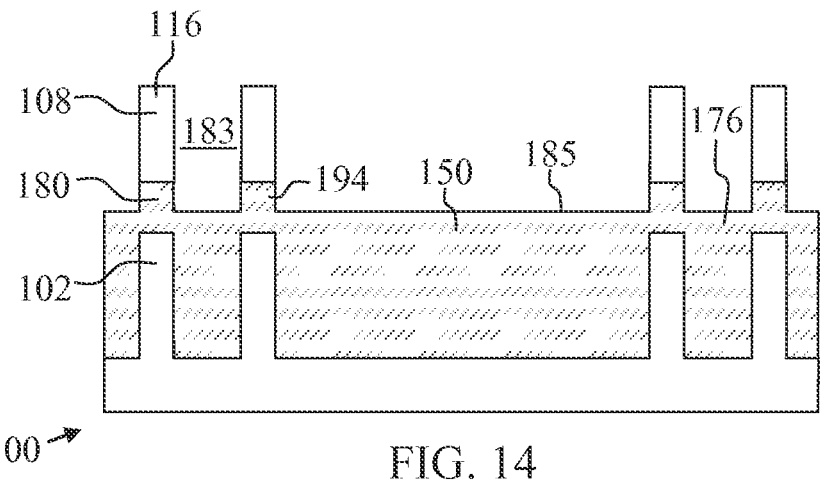
Figure 15:
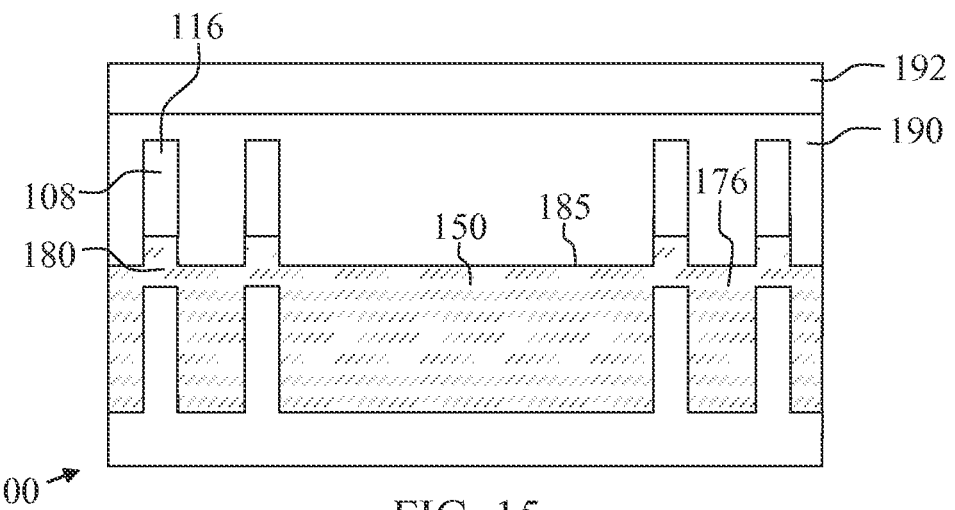

FIGS. 14 and 15 illustrate an alternate exemplary embodiment for forming gate structures, such as sacrificial or dummy gate structures over the partially completed integrated circuit 100. In FIG. 14, an anisotropic recess process is performed to form trenches 183 between the channel material 108 of the fin structures 116. As shown, the dielectric materials 150 and 176 are etched to form a lowered surface 185. The anisotropic etch may reduce variability in the height of the channel material 108 over the lowered surface 185. Lowered surface 185 meets and stops at the isolation blocks 180 formed between the channel material 108 and the semiconductor substrate 102. As a result, portions 194 of the isolation blocks 180 are exposed. In FIG. 15, a gate structure 190 is formed over integrated circuit 100. Specifically, the gate structure 190 is formed on the channel material 108, on the lowered surface 185 of the dielectric materials 150 and 176, and on the exposed portions of the isolation blocks 180. The gate structure 190 may include a gate dielectric layer lying on the channel material 108, the lowered surface 185, and the exposed portions 194 of the isolation blocks 180, as well as a sacrificial gate material, such as polysilicon, lying on the gate dielectric layer. Further, a gate cap 192 may be formed over the gate structure 190. Further conventional processing of the integrated circuit 100 of FIG. 13 may include spacer formation, source/drain formation, replacement gate formation, contact formation, and metallization As described above, a method for fabricating an integrated circuit in accordance with various embodiments provides for isolating channel regions in fin structures from the underlying semiconductor material. As a result, source-to-drain leakage is inhibited and transistor performance is improved. Further, the methods described herein facilitate removal of the sacrificial layer underlying the channel region to form voids, and filling of the voids with isolation material, by providing access through trenches formed along the sidewalls of the fin structures, rather than at the ends of fin structures. The method leverages the use of dielectric material that forms the STI to also anchor and suspend the channel regions when the voids are formed. Different than the conventional SON scheme, the methods described herein allow access along the sidewalls by forming the isolation material between the channel regions and the semiconductor substrate before gate structures are formed overlying the fin structures. By provided access to the material underlying the channel region through the side of the fin structures, the methods described herein may be performed on fin structures of varying lengths, i.e., the methods are fin length-independent.

To briefly summarize, the methods for fabrication integrated circuits described herein result in improved integrated circuit performance by reducing source-to-gate leakage. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating a FinFET transistor, the method comprising:
   forming fin structures overlying a semiconductor substrate, wherein each fin structure includes a channel material and extends in a longitudinal direction from a first end to a second end;
   depositing an anchoring material over the fin structures;
   recessing the anchoring material to form a lower trench surface bounding trenches adjacent the fin structures, wherein the anchoring material remains in contact with the first end and the second end of each fin structure; and forming a void between the semiconductor substrate and the channel material of each fin structure with a gate length independent etching process, wherein the channel material of each fin structure is suspended over the semiconductor substrate, and wherein each void is bounded by a lower void surface that is positioned above the lower trench surface of the anchoring material.

2. The method of claim 1 wherein each void is bounded by an upper void surface and wherein the method further comprises:

depositing a dielectric material over the semiconductor substrate, wherein the dielectric material is deposited in the void to create an isolation block under the channel material in each fin structure and is deposited between adjacent fin structures;

recessing the dielectric material between adjacent fin structures to a lowered surface, wherein the lowered surface of the dielectric material is positioned above the upper void surface of each void.

3. The method of claim 1 wherein each void is bounded by an upper void surface and wherein the method further comprises:

depositing a dielectric material over the semiconductor substrate, wherein the dielectric material is deposited in the void to create an isolation block under the channel material in each fin structure and is deposited between adjacent fin structures;

recessing the dielectric material between adjacent fin structures to a lowered surface, wherein the lowered surface of the dielectric material is positioned below the upper void surface of each void.

4. The method of claim 1 further comprising:

depositing a dielectric material between adjacent fin structures and in the void to create an isolation block under the channel material in each fin structure; and recessing the dielectric material between adjacent fin structures to expose a side surface of each isolation block.

5. A method for fabricating an integrated circuit, the method comprising:

forming fin structures overlying a semiconductor substrate, wherein each fin structure includes a channel material;

depositing a first dielectric material between the fin structures;

removing non-selected fin structures from the semiconductor substrate to form a gap between the first dielectric material adjacent a first selected fin structure and the first dielectric material adjacent a second selected fin structure;

depositing a shallow trench isolation material in the gap;

recessing the first dielectric material to form trenches between adjacent fin structures, between the first selected fin structure and the shallow trench isolation material, and between the second selected fin structure and the shallow trench isolation material;

forming a void between the channel material and semiconductor substrate in each fin structure to isolate the channel material; and forming a gate structure overlying the fin structure after forming the void.

6. The method of claim 5 further comprising filling each void with a second dielectric material to create an isolation block under the channel material before forming the gate structure.

7. The method of claim 5 wherein each void is bounded by an upper void surface, and wherein the method further comprises:

depositing a second dielectric material over the semiconductor substrate, wherein the second dielectric material is deposited in the voids to create an isolation block under the channel material in each fin structure and is deposited in the trenches; and recessing the dielectric material in the trenches to a lowered surface, wherein the lowered surface of the dielectric material is positioned above the upper void surface of each void.

8. The method of claim 5 further comprising:

depositing a second dielectric material over the semiconductor substrate, wherein the dielectric material is deposited in each void to create an isolation block under the channel material in each fin structure and is deposited between adjacent fin structures; and recessing the dielectric material between adjacent fin structures to expose a side surface of each isolation block.

9. The method of claim 5 wherein:

recessing the first dielectric material comprises recessing the first dielectric material to form a lower trench surface bounding the trenches; and forming the void between the channel material and the semiconductor substrate in each fin structure comprises bounding each void by a lower void surface that is positioned above the lower trench surface of the first dielectric material.

10. The method of claim 5 wherein each void is bounded by an upper void surface and wherein the method further comprises:

depositing a second dielectric material over the semiconductor substrate, wherein the second dielectric material is deposited in each void to create an isolation block under the channel material in each fin structure and is deposited between adjacent fin structures;

recessing the dielectric material between adjacent fin structures to a lowered surface, wherein the lowered surface of the dielectric material is positioned below the upper void surface of each void.

11. A method for fabricating an integrated circuit, the method comprising:

forming a fin structure overlying a semiconductor substrate, wherein the fin structure includes an underlying layer having sidewalls, a sacrificial layer having sidewalls and overlying the underlying layer, and a channel material overlying the sacrificial layer, and wherein the fin structure is positioned between a first trench and a second trench;

depositing an anchoring material in the first trench and in the second trench;

recessing the anchoring material to a lower trench surface to expose the sidewalls of the sacrificial layer and a portion of the sidewalls of the underlying layer;

etching through the sidewalls of the sacrificial layer and forming a void in the fin structure between the channel material and the semiconductor substrate;

depositing a dielectric material in the void to create an isolation block under the channel material, wherein the isolation block has sidewalls; and forming a gate structure overlying the fin structure and in direct contact with the sidewalls of the isolation block.

12. The method of claim 11 wherein the void is bounded by a lower void surface that is positioned above the lower trench surface of the anchoring material.

13. The method of claim 11 wherein forming a fin structure overlying a semiconductor substrate comprises:
   epitaxially growing the sacrificial layer over the semiconductor substrate, wherein the sacrificial layer is SiGe;
   epitaxially growing the channel material over the sacrificial layer, wherein the channel material is silicon; and
   etching trenches into the channel material and the sacrificial layer to form the fin structure; and wherein depositing a dielectric material in the void comprises depositing oxide in the void.

14. The method of claim 11 wherein forming a fin structure overlying a semiconductor substrate comprises forming a fin structure extending along a longitudinal axis from a first end to a second end, and wherein the method further comprises supporting the fin structure at the first end and the second end while etching through the sidewalls of the sacrificial layer and forming a void in the fin structure between the channel material and the semiconductor substrate.

15. The method of claim 11 wherein:
   the void is bounded by a lower surface of the channel material;
   depositing the dielectric material in the void comprises depositing the dielectric material in the first trench and in the second trench;
   the method further comprises recessing the dielectric material in the first trench and the second trench to a lowered surface; and
   the lowered surface is positioned below the lower surface of the channel material.

16. The method of claim 11 wherein depositing the dielectric material in the void comprises depositing the dielectric material in the first trench and in the second trench, and wherein the method further comprises recessing the dielectric material in the first trench and the second trench to expose sidewalls of the isolation block.

17. The method of claim 11 wherein:
   forming a fin structure overlying a semiconductor substrate comprises forming fin structures overlying the semiconductor substrate, wherein each fin structure includes an underlying layer having sidewalls, a sacrificial layer having sidewalls and overlying the underlying layer, and a channel material overlying the sacrificial layer, and wherein each fin structure is positioned between trenches;
   depositing the anchoring material in the first trench and in the second trench comprises depositing the anchoring material in the trenches;
   etching through the sidewalls of the sacrificial layer comprises etching through the sidewalls of the sacrificial layer in each fin structure and forming a void in each fin structure between the channel material and the semiconductor substrate; and
   depositing a dielectric material in the void comprises depositing a dielectric material between the fin structures and in the void in each fin structure to create an isolation block under the channel material in each fin structure; and
   the method further comprises:
      removing non-selected fin structures from the semiconductor substrate to form a gap between the anchoring material adjacent a first selected fin structure and the anchoring material adjacent a second selected fin structure; and
      depositing a shallow trench isolation material in the gap, wherein recessing the anchoring material comprises recessing the anchoring material between adjacent fin structures, between the first selected fin structure and the shallow trench isolation material, and between the second selected fin structure and the shallow trench isolation material.

18. The method of claim 11 wherein:
   the void is bounded by a lower surface of the channel material;
   depositing the dielectric material in the void comprises depositing the dielectric material in the first trench and in the second trench;
   the method further comprises recessing the dielectric material in the first trench and the second trench to a lowered surface; and
the lowered surface is positioned above the lower surface of the channel material.

19. The method of claim 11 wherein forming a fin structure overlying a semiconductor substrate comprises forming selected fin structures and non-selected fin structures overlying the semiconductor substrate, wherein each fin structure includes an underlying layer having sidewalls, a sacrificial layer having sidewalls and overlying the underlying layer, and a channel material overlying the sacrificial layer, wherein depositing the anchoring material comprises depositing the anchoring material adjacent each fin structure; and wherein the method further comprises:
   removing the non-selected fin structures and the anchoring material between the non-selected fin structures to form a gap; and
   depositing isolation material in the gap.

* * * * *